United States Patent
Kaminishi

[11] Patent Number: 5,986,481
[45] Date of Patent: Nov. 16, 1999

[54] PEAK HOLD CIRCUIT INCLUDING A CONSTANT VOLTAGE GENERATOR

[75] Inventor: Katsuji Kaminishi, Yokohama, Japan

[73] Assignee: Kabushiki Kaisha Toshiba, Kawasaki, Japan

[21] Appl. No.: 09/045,910

[22] Filed: Mar. 23, 1998

[30] Foreign Application Priority Data

Mar. 24, 1997 [JP] Japan .................................. 9-087266
Mar. 26, 1997 [JP] Japan .................................. 9-073985

[51] Int. Cl.$^6$ .................................................. G11C 27/02
[52] U.S. Cl. ............................................. 327/96; 327/539
[58] Field of Search .................................. 327/90, 91, 93, 327/94, 95, 96, 478, 490, 491, 530, 538, 539, 540, 545; 323/313, 315, 316; 341/122

[56] References Cited

U.S. PATENT DOCUMENTS

| | | | |
|---|---|---|---|
| 5,298,801 | 3/1994 | Vorekamp et al. | 327/94 |
| 5,315,170 | 5/1994 | Vinn et al. | 327/94 |
| 5,512,817 | 4/1996 | Nagaraj | 323/316 |
| 5,774,013 | 6/1998 | Groe | 327/543 |
| 5,834,927 | 11/1998 | Sugawara | 323/314 |
| 5,886,571 | 3/1999 | Suwabe | 327/541 |
| 5,910,749 | 6/1999 | Kimura | 327/541 |

FOREIGN PATENT DOCUMENTS 7-230332  8/1995  Japan .

Primary Examiner—My-Trang Nu Ton
Attorney, Agent, or Firm—Oblon, Spivak, McClelland, Maier & Neustadt, P.C.

[57] ABSTRACT

A peak hold circuit includes an error amplification circuit having a first transistor section receiving an input voltage and a second transistor section constituting a differential error amplifier together with the first transistor section. The second transistor section has a plurality of transistors connected in parallel so as to operate individually. The peak hold circuit also includes a switching circuit having a plurality of switching transistors operated in accordance with an operation voltage of each of the transistors of the second transistor section, a charging circuit including a capacitor, for charging the capacitor stage by stage in accordance with a switching operation of each of the switching transistors of the switching circuit, and an output circuit for outputting a charging potential of the capacitor as a peak value signal of the input voltage.

12 Claims, 8 Drawing Sheets

PEAK HOLD CIRCUIT INCLUDING A CONSTANT VOLTAGE GENERATOR

BACKGROUND OF THE INVENTION

1. Field of the Invention

The present invention relates to a peak hold circuit favorably applied to a light receiving circuit for optical interconnects and a constant-voltage generating circuit favorably applied to a laser driving circuit.

2. Discussion of the Background

A technique of detecting an analog signal at high speed and converting it into a digital signal has recently been essential to a multimedia instrument and the like. A sample hold circuit is necessary for an analog-to-digital conversion. As one method of the sample hold circuit, there is a combination of a high-speed switch circuit and a voltage holding capacitor, for catching analog signals sampled in a short time slot and holding their peak values.

Of circuits for processing digital signals only, there are a circuit for optical telecommunications and optical interconnects, a signal readout circuit for a magnetic memory and semiconductor memory, and the like, the input signal levels of which are varied and unclear. In these circuits, it is important that an input signal level of the preamplifier is detected automatically to determine the optimum operation point and minimize a distortion of waveform of a reproduced pulse.

In order to minimize the distortion, an automatic discrimination type waveform reproduction circuit has been employed which detects and normalizes a peak level of an input pulse signal to always discriminate the pulse signal by half the amplitude of the pulse signal irrespective of variations in the level of the input pulse signal.

It is a peak hold circuit that is important in common to the foregoing examples. In particular, it is desirable for a circuit for processing a signal with an arbitrary pattern, such as the optical interconnection, to respond to a burst waveform and it is important to respond at high speed of not less than nanoseconds in order to correctly detect and hold a peak value of the first-input pulse. Recently there have been great demands that the peak hold circuit should be relatively small in size or compact so as to be incorporated into an IC without any external capacitor. Also there have been demands for low power consumption in order to incorporate the peak hold circuit into a multichannel array.

The fundamental arrangements of known prior art peak hold circuits are illustrated in FIGS. 1 and 2 and the operation principle of each circuit is as follows. In the circuit of FIG. 1, a pulse input to an input terminal of a differential amplifier constituted of transistors Q100 and Q101, is compared with an output voltage of the peak hold circuit and, if the voltage of the input pulse is higher than the output voltage, an error is amplified and the base voltage of a switching transistor Q102 is increased. Thus, the transistor Q102 is turned on to start charging a voltage holding capacitor C100. When an output voltage of an emitter follower circuit of a transistor Q103 reaches the voltage of the input pulse, the base voltage of the transistor Q102 is lowered to cut off the current flowing into the transistor Q102. If the top voltage of the input pulse is maintained until the current is cut off the voltage with which the voltage holding capacitor C100 is charged, becomes equal to the peak voltage of the input pulse.

Since the leak peak current of the transistor Q103 is low, the time constant of discharging of the capacitor is large and its peak voltage is maintained.

The operation of the switching transistor Q102 will be described in more detail. The transistor Q102 is a bipolar transistor and thus has a characteristic of causing a current to flow exponentially with respect to a base-to-emitter voltage. When the amplitude of input voltage of the base is small, the dynamic impedance is high, the injected current is small, and the peak transit time is long. On the other hand, when the amplitude exceeds a certain value, the impedance is drastically lowered and the charging time is too short, with the result that a feedback is delayed and so is the cutoff of the switching transistor, thus causing an overshoot of the output voltage.

Consequently, an input voltage range for normally operating the circuit is restricted, and it is difficult to widen an input dynamic range. If the input voltage is too high, a collector current may flow through the transistors beyond a tolerable range, and the cutoff frequency may decrease, thereby causing a delay in response.

A circuit capable of excluding the above drawbacks to some extent, is shown in FIG. 2. In the circuit of FIG. 2, a voltage holding capacitor C100 is charged with a current which is almost proportional to the amplitude of an error voltage by a current output amplifier using a pnp transistor in place of a switch of an npn transistor (shown in FIG. 1) with drastically changing impedance. In the circuit of FIG. 2, a power supply voltage needs to be higher than that of the circuit of FIG. 1 and the pnp transistor should satisfy a high speed operation.

In general, however, the bandwidth of the pnp transistor is about one-tenth of that of the npn transistor; thus, the circuit of FIG. 2 has an essential problem that a high-speed operation cannot be satisfied.

The problem of the circuit shown in FIG. 1 on principle is an exponentially, nonlinear response to an input voltage of a switching transistor. However, this problem can be resolved if, as in the circuit of FIG. 2, the npn switching transistor is operated so as to exhibit a linear response to the input voltage.

A high gain feedback amplifier may be useful for the peak hold circuit in order to linearly operate an element originally having a remarkably nonlinear characteristic. In this case, usually, there occurs a problem that a high-speed operation cannot be carried out due to a delay in a high gain feedback as well as a problem that a large-sized circuit increases in chip area and thus in power consumption.

BRIEF SUMMARY OF THE INVENTION

An object of the present invention is to provide a peak hold circuit having characteristics of widening a dynamic range of the amplitude of an input voltage and responding to a burst waveform input at high speed, though the circuit is constituted simply of a small number of elements.

Another object of the present invention is to provide a stable constant voltage generator and a laser driving circuit which are favorably applied to a peak hold circuit or the like and operated sufficiently stably against variations in temperature and input power supply voltages.

To attain the above objects, there is provided a peak hold circuit comprising:

an error amplification circuit including a first transistor section receiving an input voltage and a second transistor section constituting a differential error amplifier together with the first transistor section, the second transistor section having a plurality of transistors connected in parallel so as to operate individually;

a switching circuit including a plurality of switching transistors operated in accordance with an operation voltage of each of the transistors of the second transistor section;

a charging circuit including a capacitor, for charging the capacitor stage by stage in accordance with a switching operation of each of the switching transistors of the switching circuit; and an output circuit for outputting a charging potential of the capacitor as a peak value signal of the input voltage.

The peak hold circuit having the above-described constitution is based on the fundamental circuit, as shown in FIG. 1, for both achieving a high-speed response and performing an operation at a low power supply voltage. It has been already mentioned that a fundamental problem of disadvantage in characteristics of the circuit exists in a switching circuit. In other words, an npn switching transistor supplies a current exponentially with respect to an input voltage. Instead of the switching transistor having a characteristic of supplying the current varying remarkably nonlinearly, a switching circuit having a characteristic of causing a current, which varies almost linearly, to flow, can be used. Since, however, the peak hold circuit is a feedback amplification circuit, a deviation from a desired characteristic is reduced to a value obtained by dividing an input value by a loop gain; therefore, it is unnecessary to achieve a strict linearity characteristic.

In order to achieve the linearity characteristic within a fixed error range, a plurality of switches are used and arranged in such a manner that they are turned on stage by stage by different values of input voltage and the current value is increased at the later stage to make an integrated value of synthesized current linear.

More specifically, each of paired amplification transistors of a differential amplifier for amplifying an error, is constituted of two or more groups of basic transistor elements, and the base and emitter of each transistor are connected to each other. The collectors of one of the amplification transistors are connected together and employed at once. In the other amplification transistor, a load resistor and a current switching transistor for injecting charges into a voltage holding capacitor are connected to the collectors of each group of transistor elements. The base and emitter of each transistor element are connected to each other, and the same unit current flows through the collectors of the transistor elements of the same group. A value obtained by multiplying the number of transistor elements of each group by the unit current and load resistor, corresponds to a voltage difference for turning on a switch.

The emitter of a current switching transistor constituted of a plurality of stages is connected to a single voltage holding capacitor through a current feedback resistor. The base switch start voltage of the current switching transistor is set such that the switching transistor is operated step by step. The number of transistor elements constituting a stage to be operated first is set small and then increased gradually after the subsequent stage. In order to control a value of the current feedback resistor for restricting a decrease in impedance of the switching transistor and limit the current of the preceding stage when the need arises, a collector load resistor for saturating the transistor is provided.

Thus, the switching transistors are turned on gradually from the smaller one, and the voltage of a charged capacitor, which is indicated by the polygonal wheat line approximation, reaches the input voltage within a fixed period of time and varies in proportion to the amplitude of the input voltage.

If a power supply voltage for operating the peak hold circuit is low and an operation voltage cannot be secured in a vertical stack structure of a multi-stage switching transistor and an emitter follower circuit, the peak hold circuit can be operated at a power supply voltage which is dropped by the base-to-emitter voltage of 0.65V to 0.85V by connecting the emitter follower circuit to the voltage holding capacitor not directly but through a differential amplification circuit provided after the capacitor.

The non-inverting input terminal of a newly inserted differential amplifier is connected to an output voltage of the capacitor, and the inverting input terminal is connected to a point connected to the output voltage of the peak hold circuit and the reference voltage of the input voltage thereof through their respective resistors.

An amplification factor of 1 or more can be obtained by controlling a value of the resistor connected to the inverting input terminal. The larger the amplification factor, the lower the charging output voltage of the voltage holding capacitor. Since an operation range of the switch operated in response to an input voltage is not changed, an effect of widening the input dynamic range of the entire circuit can be expected.

There is a case where an input reference voltage is not always fixed absolutely in a circuit to which the peak hold circuit of the present invention is applied. In this case, non-inverting and inverting signals are generated and an halfway point between them may be considered to be a reference voltage. It is thus possible to obtain the same performance as that of a circuit having a greatly varying external reference voltage by connecting the non-inverting and inverting signals to the inverting input terminal through different resistors, in place of the resistor connected to the reference voltage.

In order to attain the above objects, the constant voltage generator according to the present invention includes:

a band-gap reference voltage source section having a plurality of transistors and a plurality of resistors, for generating a constant voltage corresponding to a band-gap voltage of silicon; and a constant current source section having a current generator having a first transistor and a second transistor constituting an input stage of the band-gap reference voltage source section, a third transistor connected in series to the second transistor of the current generator, a fourth transistor of a diode-connection type connected to a base of the third transistor, a first resistor connected between a power supply and a base of the fourth transistor, and a second resistor connected between the third transistor and a ground.

In the constant voltage generator circuit described above, the fourth transistor is diode-connected through the first resistor connected to the power supply and it is connected to the constant voltage output from the band-gap reference voltage source. A voltage at the connecting point of the first resistor and the fourth transistor is applied to the base of the third transistor for generating a constant current, and the second resistor is connected between the emitter of the third transistor and the ground. In this circuit configuration, the voltage applied to both ends of the second resistor is fixed with hardly depending upon variations in temperature or power supply voltage. The current output from the collector of the third transistor of the base grounded type is fixed. This output current is received by the load whose resistor is connected in series to a diode-connected second transistor of a complementary type of the band-gap reference voltage source, and converted into a voltage. Moreover, this voltage is set as a reference voltage, and a current is generated from a circuit having a resistor whose value is the same as that of the complementary type first transistor of the same size.

The current so generated has a mirror-inverted value and corresponds to a temperature independent constant current. As a result, the current flowing into the band-gap reference voltage source section is fixed without depending upon the operation environment such as variations in temperature and power supply voltage.

Consequently, the temperature dependency of output voltage can be minimized by finally controlling an element value of the band-gap reference voltage source, and a stable voltage can be generated.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

A preferred embodiment of the present invention will now be described with reference to the accompanying drawings.

Figure 1:
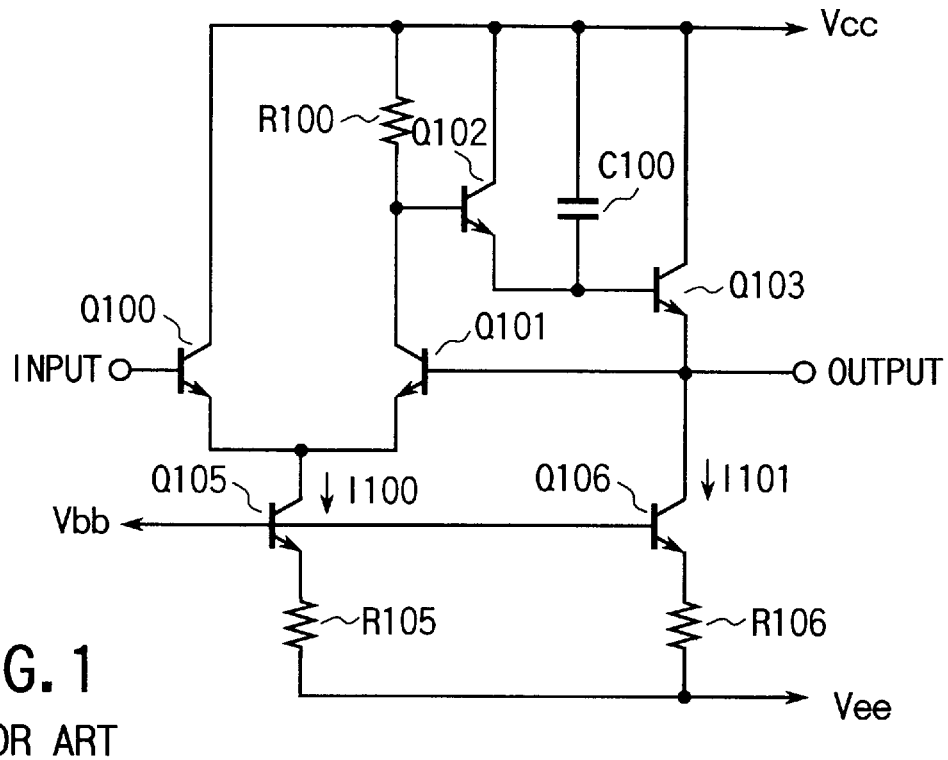
FIG. 1 is a circuit diagram showing an example of a prior art peak hold circuit.
Figure 2:
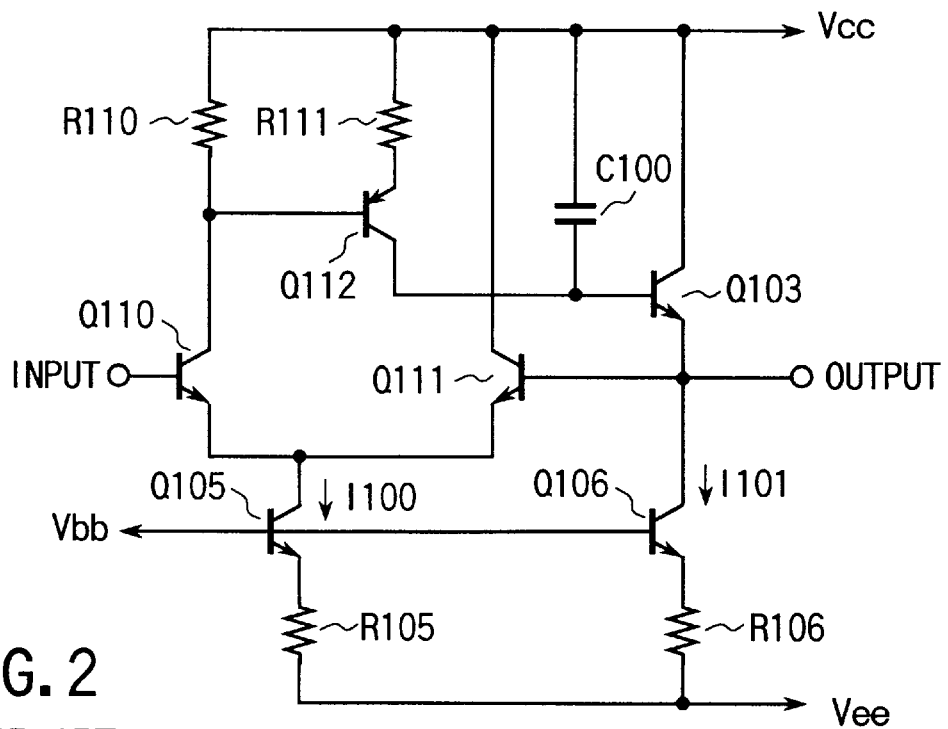
FIG. 2 is a circuit diagram showing another example of the prior art peak hold circuit.
Figure 3:
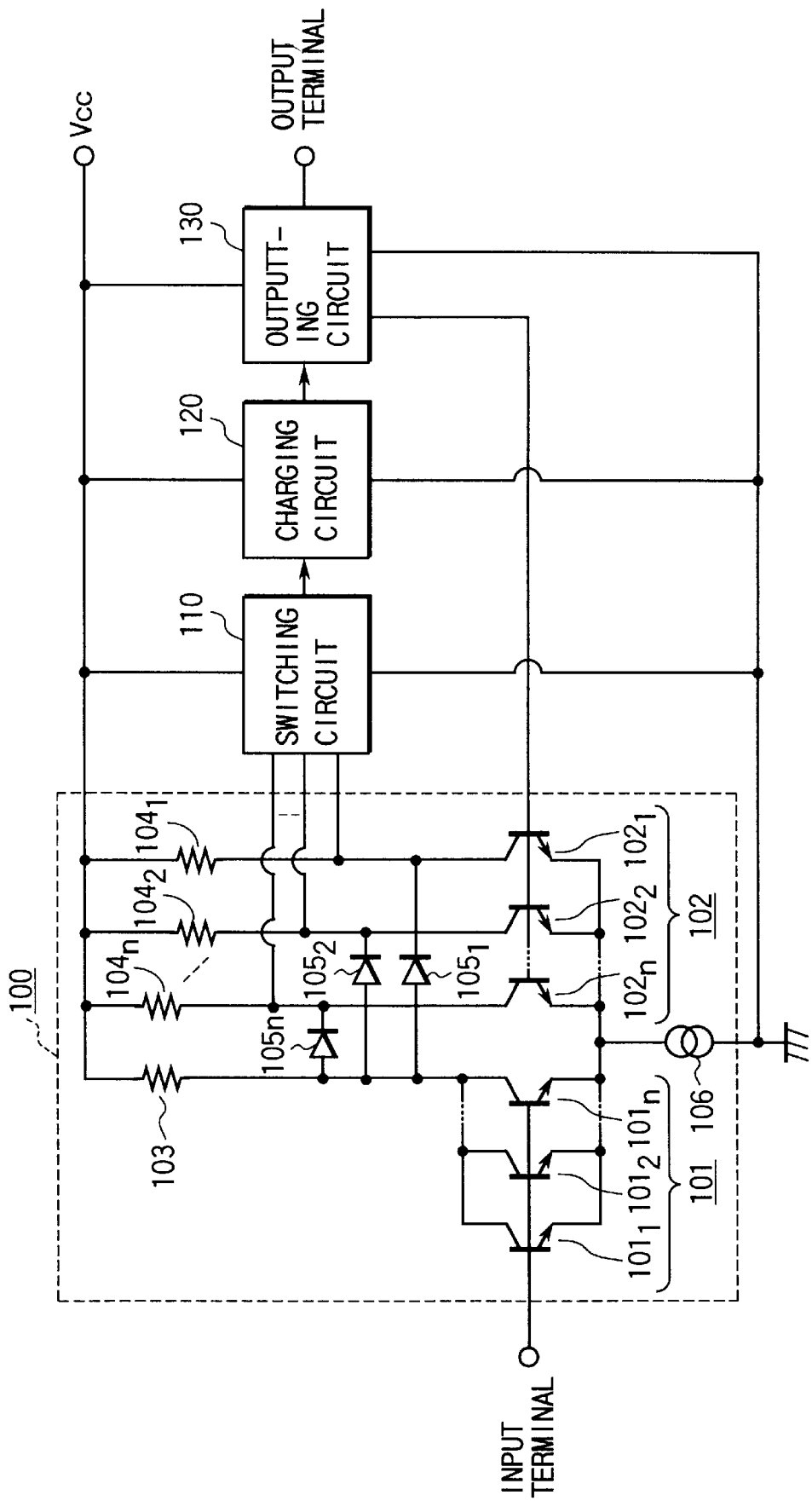
FIG. 3 is a circuit diagram illustrating a peak hold circuit of the present invention.

FIG. 3 illustrates a peak hold circuit according to the embodiment of the present invention. This circuit includes an error amplifying circuit 100, a switching circuit 110, a charging circuit 120 and an output circuit 130.

Figure 8:
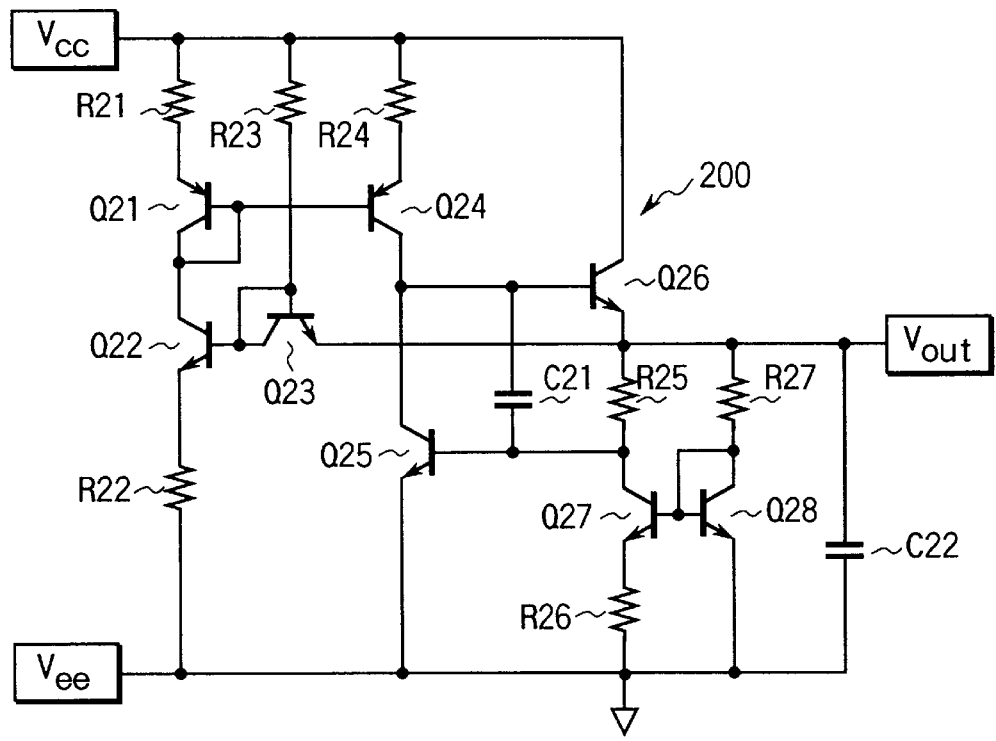
FIG. 8 is a circuit diagram illustrating a constant voltage generator according to the embodiment of the present invention.

The error amplifying circuit 100 has a first transistor section 101 for receiving an input voltage, a second transistor section 102 which constitutes a differential error amplifying circuit together with the first transistor section 101, a resistor 103 connected between the first transistor section 101 and power supply Vcc, a resistor 104 ($104_1$, $104_2$, ..., $104_n$) connected between the second transistor section 102 and power supply Vcc, a diode 105 ($105_1$, $105_2$, ..., $105_n$) which constitutes a clamp circuit together with the resistor 103 in order to clamp the second transistor section 102 to a predetermined voltage, and a constant-current source 106. The constant current source 106 includes a constant voltage generator circuit, which is shown in FIG. 8 and will be described later.

The first transistor section 101 has a plurality of transistors $101_1$, $101_2$, ..., $101_n$ which are arranged in parallel so as to be operated together. The second transistor section 102 has a plurality of transistors $102_1$, $102_2$, ..., $102_n$ which are arranged in parallel so as to be operated individually.

The switching circuit includes a plurality of switching transistors for performing a switching operation in accordance with an operation voltage of each of the transistors $102_1$, $102_2$, $102_n$ of the second transistor section 102.

The charging circuit 120 has a capacitor and charges it stage by stage in accordance with a switching operation of each switching transistor of the switching circuit 110. The output circuit 130 includes a circuit such as an emitter follower circuit and outputs a charged potential of the capacitor of the charging circuit 120 as a peak value of the voltage input to the first transistor section 101.

Figure 4:
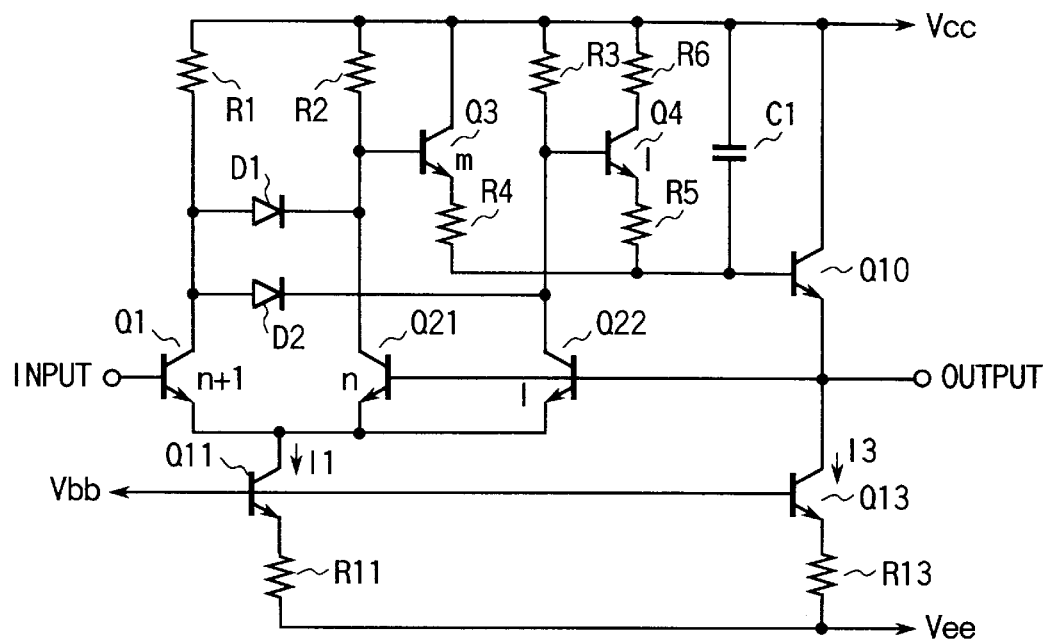
FIG. 4 is a circuit diagram illustrating an example of a peak hold circuit according to an embodiment of the present invention.

The circuit arrangement of the peak hold circuit shown in FIG. 3 will now be described concretely with reference to FIG. 4. The circuit of FIG. 4 is constituted of the minimum number of elements for fulfilling a function of the present invention. A differential error amplifier, which corresponds to the error amplifying circuit 100 shown in FIG. 3, includes a constant current generator having a transistor Q11 and a resistor R11, for generating current I1 and outputting bias voltage Vbb, a transistor Q1 formed of n+1 transistor elements, a small transistor Q21 formed of n transistor elements, a small transistor Q22 formed of one transistor element, and load resistors R1, R2 and R3. The bias voltage Vbb is applied from a constant voltage generator circuit, which is shown in FIG. 8 and will be described later.

The emitters of transistors Q21 and Q22 are connected to each other, as are the bases thereof. Thus, the collector current of transistor Q21 is n times as large as that of transistor Q22. When the input and output voltages of the circuit are at the same level, i.e., in the steady state, a switching transistor Q4 has a threshold voltage in each of conductive and nonconductive states. The values of load resistors R2 and R3 are set properly such that a voltage difference (R3−n*R2)/2(n+1) becomes positive. When the input voltage increases and the base-to-emitter voltage of transistor Q3 decreases by the increase, the transistor Q3 changes from the nonconductive state to the conductive one. The voltage difference, which depends upon the characteristics of a transistor and a bias voltage, is favorably set between 0.1V and 0.9V in a typical Si bipolar transistor.

In general, the switching transistor Q4 has a plurality of transistor elements. When a capacitor C1 is small, it is advisable that the number of elements is one in order to respond to a very low input voltage. When the capacitor C1 is large and the charging current has to be increased, if the input voltage is not so low, it is advisable that the number of elements is one or more.

The size m of transistor Q3 is set to an integer which is equal to or slightly larger than a value obtained by dividing the maximum peak charging current of the capacitor C1 by the maximum allowable current. The switching transistor Q4 at the first stage has a problem that an over-current flows beyond the allowable current or the polygonal line approximation of linear response since an impedance has to be low to some extent even when the input voltage is low. In order to resolve the problem, a resistor R6 is connected to the collector of transistor Q4 and its value is set such that the transistor Q4 has a saturated voltage when the limited current becomes the largest.

Figure 5:
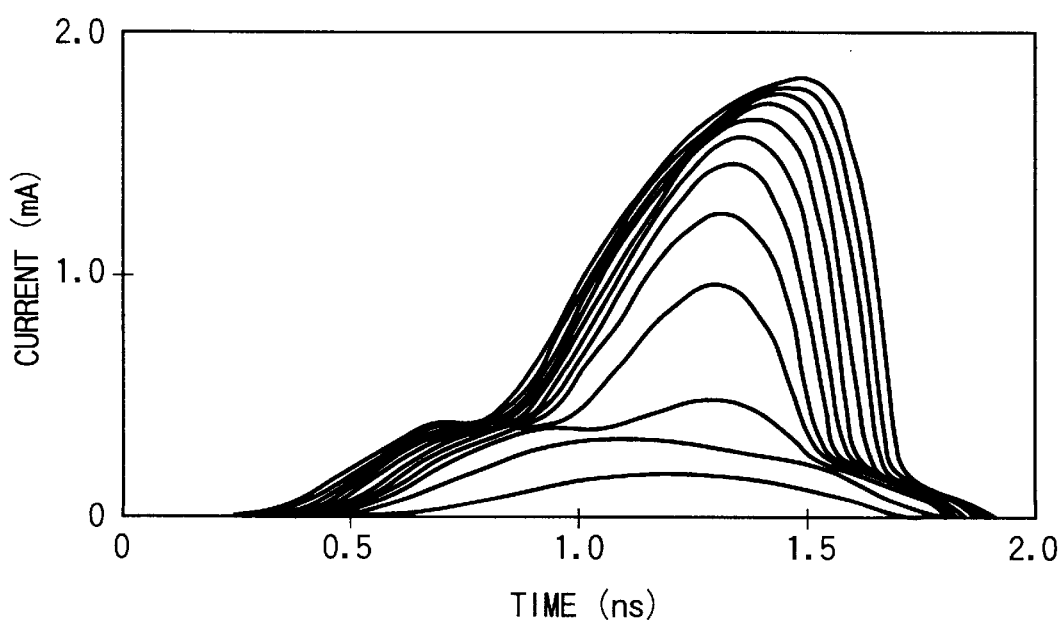
FIG. 5 is a graph showing a simulation of waveforms of currents flowing into a voltage holding capacitor.

FIG. 5 is a graph of a simulation of waveforms of currents flowing into the voltage holding capacitor C1 (=4 pF) when the first pulse whose amplitude ranges from 0.03V to 0.4V is input, where R4=30Ω, R5=250Ω, R6=3.9 kΩ, and m=5. As shown in FIG. 5, when the amplitude of the input pulse is small, only the transistor Q4 is turned on. As the amplitude increases, the peak current is limited to about 0.4 mA and then the transistor Q3 starts to turn on and the current increases gradually. A voltage is generated in proportion to a value obtained by integrating the current. Also this voltage is almost proportional to the input pulse.

As is apparent from FIG. 5, the waveforms of currents exhibit complicated variations varied with the amplitudes of input pulses and greatly differences from those varied smoothly in a similar fashion as in a normal analog circuit. Since the currents flowing through the transistors are exponential with respect to the base-to-emitter voltage, current feedback resistors R4 and R5 are provided at the emitters of transistors Q3 and Q4 to improve in nonlinear response. The optimum values of the current feedback resistors are determined in accordance with the amplitude of error amplification voltage to be obtained in an amplifier, the current which is to charge the voltage holding capacitor C1, the size of each of transistors Q3 and Q4, and the maximum voltage amplitude for holding a peak value. In order to keep the voltage with which the voltage holding capacitor C1 has been charged, the output of the voltage holding capacitor C1 amplified by an emitter follower circuit constituted of a constant current generator circuit 13 and a transistor Q10 and decreased in leakage current.

As the input signal of the circuit shown in FIG. 4 is a voltage pulse, both transistors Q21 and Q22 are saturated during the period from the time just of the peak value of the input pulse to the next receiving time of the pulse including the period of the logically low-level voltage. This saturation lengthens a time for restoring the transistors when the next pulse is input and thus causes a delay in response. Since, moreover, the current flowing into the base during the saturation is increased remarkably, the current of transistor Q10 increases and so does the leakage current of the voltage holding capacitor C1, thereby shortening the holding time. To prevent this, the resistor R1 is connected to diodes D1 and D2 to maintain the saturation of transistors Q21 and Q22 at a low level. In other words, the collector potential of transistor Q21 is clamped by the resistor R1 and diode D1, as is that of transistor Q22 by the resistor R1 and diode D2.

The value of resistor R1 is determined so as to maintain a cutoff condition of diodes D1 and D2 in the steady state and maintain the saturation of transistors Q21 and Q22 at a low level.

In the foregoing embodiment, the sum total of the base-to-emitter voltages of switching transistors Q3 and Q4, a voltage for normally operating an emitter follower circuit of transistor Q10, and a voltage required for a constant current generator as well as terminal voltages of load resistors R3 and R6 necessary for operating an error differential amplifier, is a minimum amount necessary for the power supply voltage.

If a transistor is a Si bipolar but operated at high speed, its base-to-emitter voltage is about 0.85V at an operating point. In the circuit configuration of FIG. 4, therefore, it is difficult to operate the circuit at a power supply voltage of 3.3V or lower even when the amplitude is about 0.5V. This problem can be resolved by the circuit shown in FIG. 6. In the circuit of FIG. 4, the emitter follower circuit of transistor Q10 is directly connected to the voltage holding capacitor C1; however, in that of FIG. 6, a constant current generator including a transistor Q12 and a resistor R12 and outputting a bias voltage Vbb, is connected to the emitter follower circuit of transistor Q10 through a differential amplifier circuit including the transistors Q5 and Q6 whose emitters are connected to each other and the resistor R7. The bias voltage Vbb is applied from a constant voltage generator shown in FIG. 8, which will be described later. A voltage of the capacitor C1 is applied to the base of transistor Q5 receiving a non-inverting signal, an output of the emitter follower circuit is applied to the base of transistor Q6 receiving its inverted voltage, and an output of transistor Q6 is supplied to the output terminal through a resistor R8. At the same time, a voltage corresponding to the reference voltage of the input terminal is applied to an external input Vref through a resistor R9.

The differential amplifier circuit creates the following two effects. First, the base-to-emitter voltage of 0.65V to 0.85V, which was required for the emitter follower circuit, is unnecessary and thus the circuit can be operated at a power supply voltage which is lowered by the unnecessary voltage. Secondly, the loop gain is increased (1+R8/R9) times. Though the gain does not change when the resistor R8 is at zero, an amplification factor of one or more is obtained when the gain exceeds zero. The larger the amplification factor, the lower the voltage charging the voltage holding capacitor. However, the available range of the switch operated in response to an input voltage is unchanged and thus the dynamic range can be widened.

Figure 6:
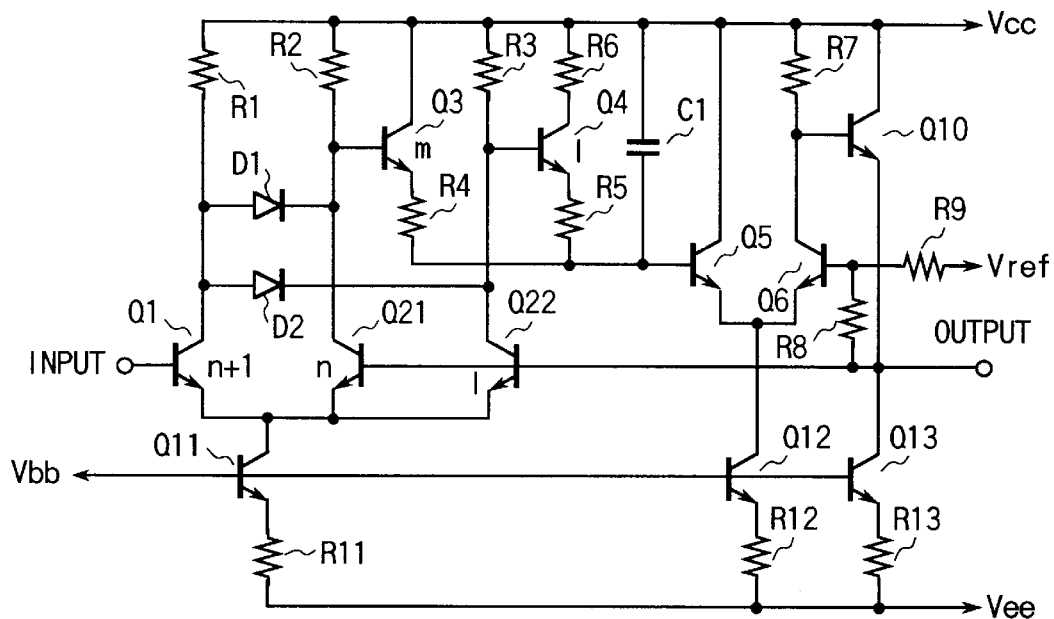
FIG. 6 is a circuit diagram showing an example of a peak hold circuit according to the embodiment of the present invention, which is applied to a low voltage.
Figure 7:
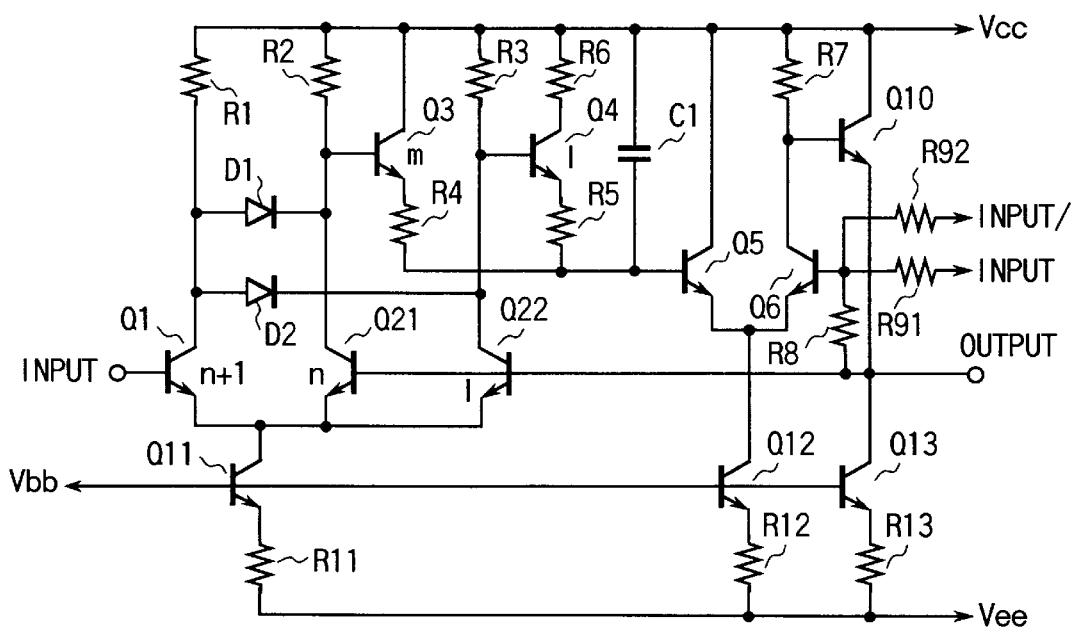
FIG. 7 is a circuit diagram showing another example of the peak hold circuit according to the embodiment of the present invention, which is applied to a low voltage.

In the circuit illustrated in FIG. 6, a reference voltage need to be applied to the input terminal (Input). The input reference voltage is not always fixed to a desired circuit, and there is a case where non-inverting and inverting signals are produced at the preceding stage amplifier and a halfway point between them is considered to be a reference voltage. Such a reference voltage corresponds to, for example, an output of a differential amplifier circuit such as a differential transfer impedance circuit. In this case, in place of the reference voltage Vref and resistor R9 connected thereto shown in FIG. 6, non-inverting and inverting signals Input and Input/ and resistors R91 and R92 can be used, as shown in FIG. 7, and these signals Input and Input/ are connected to the base of transistor Q6, which receives an inverting signal, through the resistors R91 and R92 each having a value which is twice as high as that of resistor R9. The circuit of FIG. 7 is able to fulfill the same function as that of the circuit of FIG. 6 without providing any complicated circuit for generating an adjusting external reference voltage.

In the foregoing embodiment, two switching transistors are used, and the first one of them has a size of 1. It is needless to say that the size of the first switching transistor can be 2 or more and the number of switching transistors can be 3 or more to improve in linear approximation. This arrangement depends upon the balance of circuit size, circuit design, and circuit performance. Furthermore, in the above embodiment, the present invention is applied to a Si bipolar transistor but can be applied to an HBT (hetero-junction bipolar transistor) of GaAs, InP or SiGe.

The constant voltage generator circuit 106, which is used as a constant-current source shown in FIG. 3 to generate bias voltage Vbb (FIGS. 4, 6 and 7), will now be described with reference to FIG. 8.

The constant voltage generator circuit includes a band-gap reference voltage source section 200 and a constant current generator section. The circuit of FIG. 8 generates a positive reference constant voltage and is basically constituted by adding two transistors Q22 and Q23 of the same size and a resistor R23 to the prior art circuit. The collector and base of transistor Q23 are connected to each other to perform equivalently the same operation as that of a diode. The collector of transistor Q23 is connected to a power supply Vcc via the resistor R23, and the emitter thereof is connected to a reference voltage output terminal Vout. A value obtained by dividing a value, which is obtained by subtracting both output reference voltage Vout and a forward voltage of the diode from power supply voltage Vcc, by a value Ib of current to be caused to flow through the diode, is determined as a resistance value of resistor R23. This resistance value can be set greatly higher than a differential resistance of the diode. Moreover, the value of resistor R22 is determined so as to be equal to Vout/Ib, and a difference in voltage between both ends of resistor R22 is maintained at the output reference voltage Vout, irrespective of variations in temperature and power supply voltage, when a voltage higher than the base voltage is applied to the collector of transistor Q22.

As a result, a fixed amount of current Ib, which is temperature-independent, flows into the collector of transistor Q22. If the complementary pnp transistors Q21 and Q24, to an npn transistor used in the band-gap reference voltage source section and constant current source, have the same size and the resistors R21 and R24 have the same resistance value, the temperature-independent current Ib flows from the collector of transistor Q24 and into the band-gap reference voltage source. In this state, the temperature dependency of output voltage is minimized by controlling an element value of the band-gap reference voltage source.

Figure 9A:
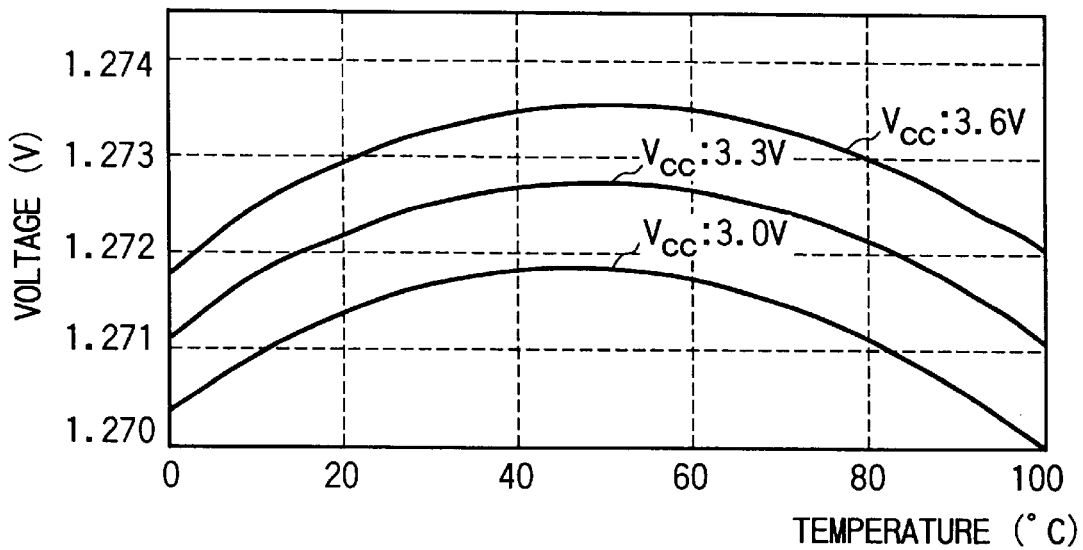
FIG. 9A is output voltage a characteristics depending on IC chip temperature in the constant voltage generator according to the embodiment of the present invention.
Figure 9B:
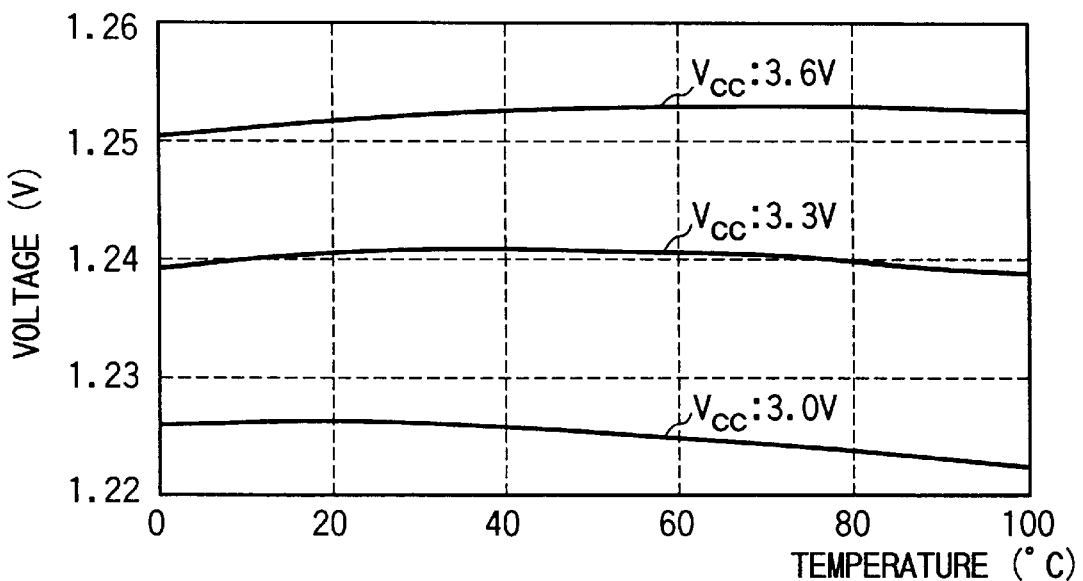
FIG. 9B is output voltage characteristics depending on IC chip temperature in a prior art constant-voltage generator.

Consequently, a stable, fixed voltage can be generated even when the power supply voltage is varied. As is seen from FIG. 9A, the variations in output due to those in power supply are substantially the same as those in temperature, and they are improved about ten times as much as those of the prior art as shown in FIG. 9B.

In the above embodiment, the current amplification factor of the transistor is considerably high and the base current has an ignorable, idealistic value; actually, there are many cases where the characteristics of the elements deviate from idealistic ones. In this case, however, the temperature coefficient of the generated voltage can be set either positive or negative by controlling the values of circuit elements of the band-gap reference voltage source, so that the deviation from the ideal characteristic can be compensated. In particular, the characteristics can be controlled even by slightly shifting the relative value of each of resistors R21, R22 and R24 from the exactly same, and there is a great room to control the characteristic.

Figure 10:
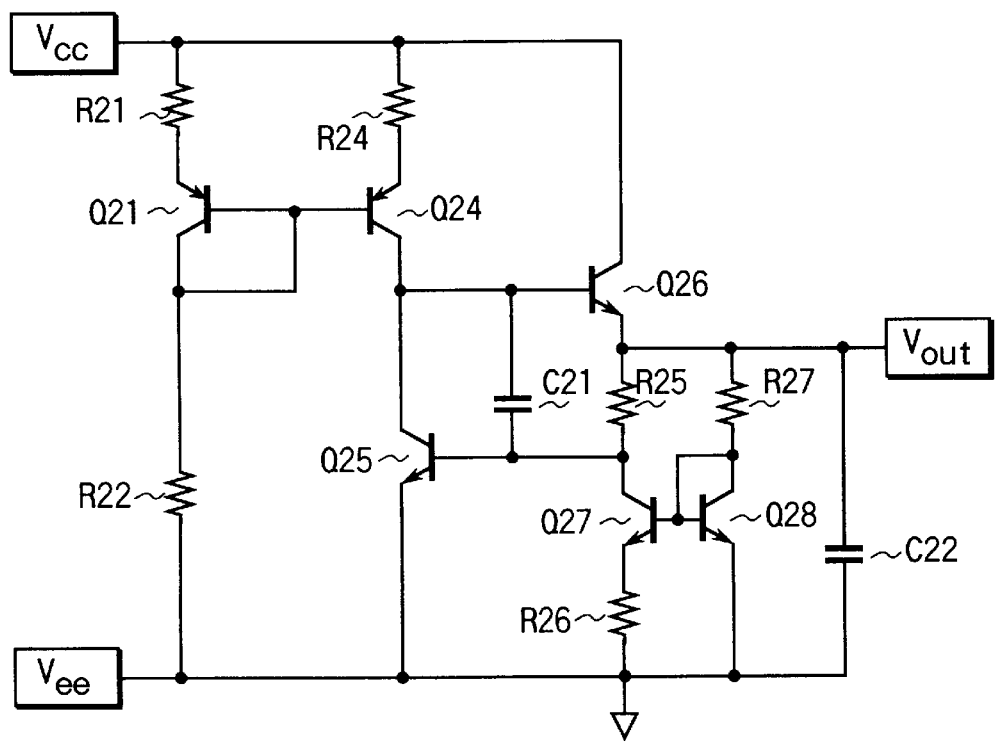
FIG. 10 is a circuit diagram illustrating an example of the prior art constant-voltage generator.

The circuit of the foregoing embodiment is constituted by adding only three elements to the prior art circuit shown in FIG. 10 and its size is not so changed, thereby making the circuit compact. In FIG. 10, C21 and C22 indicate capacitors for preventing oscillation and suppressing high frequency noise.

The current flowing through the transistor Q23 simply reduces the current to be supplied from the transistor Q26 to operate the circuit, and all the consumed current can be set unchanged, with the result that no power consumption is increased. For this reason, an increase in both chip area and power consumption can be minimized when a reference voltage is applied independently to secure isolation, as in the array circuit.

In the present invention, the bias current of the operating circuit is controlled based on its own output, so that it is likely that the operating circuit will be trapped in an unexpected, stable point and will not be normally operated. However, this problem can be avoided since a starting current flows through the resistor R23 and transistor Q23. Since, furthermore, the npn transistors or pnp transistors, which carry out the same characteristic, are operated independently, it is unnecessary to completely make the characteristics of the npn and pnp transistors complementary to each other, such as temperature compensation of base-to-emitter voltage.

The circuit for generating a positive reference voltage has been described so far. To generate a negative reference voltage, the npn transistor and pnp transistor are inverted. Needless to say, the transistors are not limited to an HBT of Si but can be applied to an HBT of SiGe, GaAs, InP or the like, if they are of a bipolar type.

Figure 11:
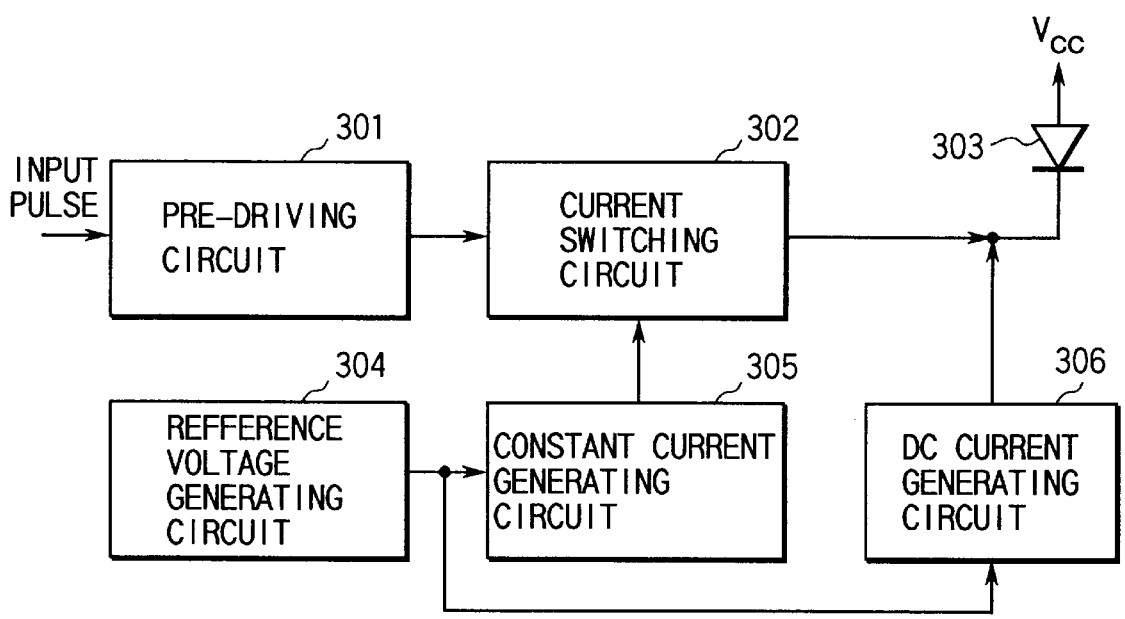
FIG. 11 is a block diagram showing an example of a laser driver according to the embodiment of the present invention.

A laser driver circuit to which the constant-voltage generation circuit shown in FIG. 8 is applied, will now be described with reference to FIG. 11. The laser driver circuit includes a pre-driver circuit 301 to which a pulse signal is input, a current switching circuit 302 for driving a laser diode 303, a reference voltage generation circuit 304, a constant-current generation circuit 305, and a DC bias current generation circuit 306. The circuit 304 is equivalent to the circuit shown in FIG. 8.

The reference voltage generated by the reference voltage generation circuit 304 is applied to the constant-current generation circuit 305 and DC bias current generation circuit 306. Thus, a predetermined constant current and DC bias current are generated from these circuits 305 and 306. The output of the pre-driver circuit 301 is supplied to the current switch circuit 302 to which a current has been supplied from the constant current generation circuit 305, and the output of the circuit 302 is supplied with a bias current from the DC bias current generation circuit 306 to supply a driving current to the laser 303.

As described above, according to the present invention, there can be provided a peak hold circuit capable of securing a wide dynamic range of input without increasing in size so much or decreasing in operation speed and capable of being operated at a low power supply voltage.

The peak hold circuit includes a band-gap reference voltage source having a plurality of transistors and a plurality of resistors, for generating a constant voltage corresponding to a band-gap voltage of silicon, and a constant-current generating section having a current source circuit having first and second transistors constituting an input stage of the band-gap reference voltage source section, a third transistor connected in series to the second transistor of the current-source circuit, a fourth transistor of a diode-connection type connected to the base of the third transistor, a first resistor connected between the power supply and the base of the fourth transistor, and a second resistor connected between the fourth transistor and the ground. Therefore, a constant-voltage generator the occupied area of which is almost equal to that of the prior art circuit and the power consumption of which is low, can be provided by simply adding several transistors and resistors to the prior art circuit.

Figure 12:
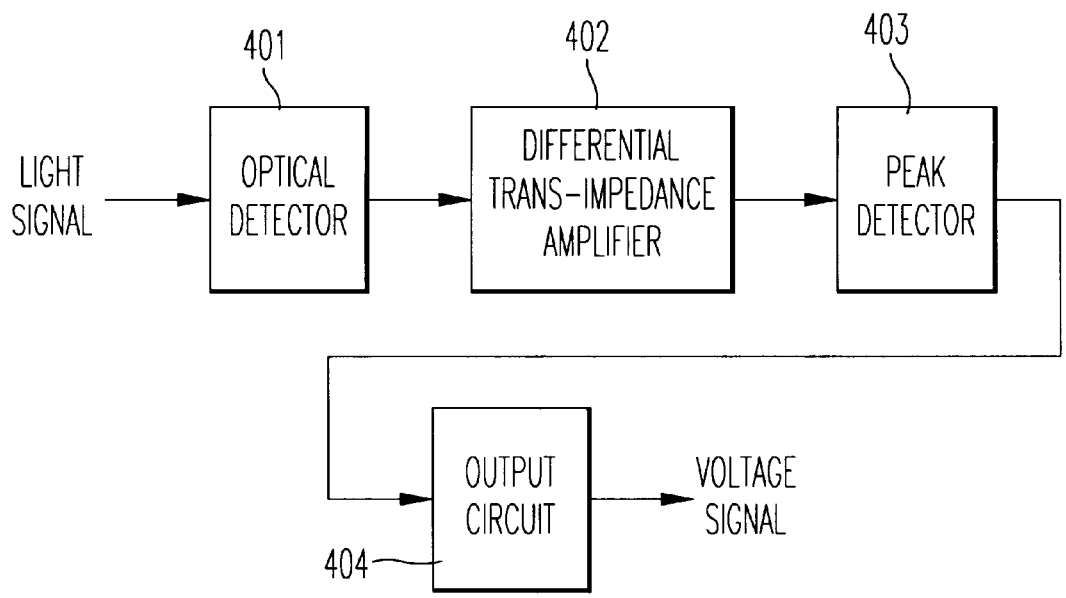
FIG. 12 is a block diagram showing an example of a light-receiving circuit according to the embodiment of the present invention.

FIG. 12 is a block diagram showing an example of a light-receiving circuit according to the embodiment of the present invention and including an optical semiconductor detector 401 for converting a received light signal to a current signal, a differential transimpedance amplifier 402 for receiving the current signal and outputting a voltage signal, a peak detector 403, as previously described, for receiving the voltage signal and outputting a peak value signal of the voltage signal, and an output circuit 404 for receiving the peak value signal and outputting a voltage signal corresponding to the light signal.

Figure 13:
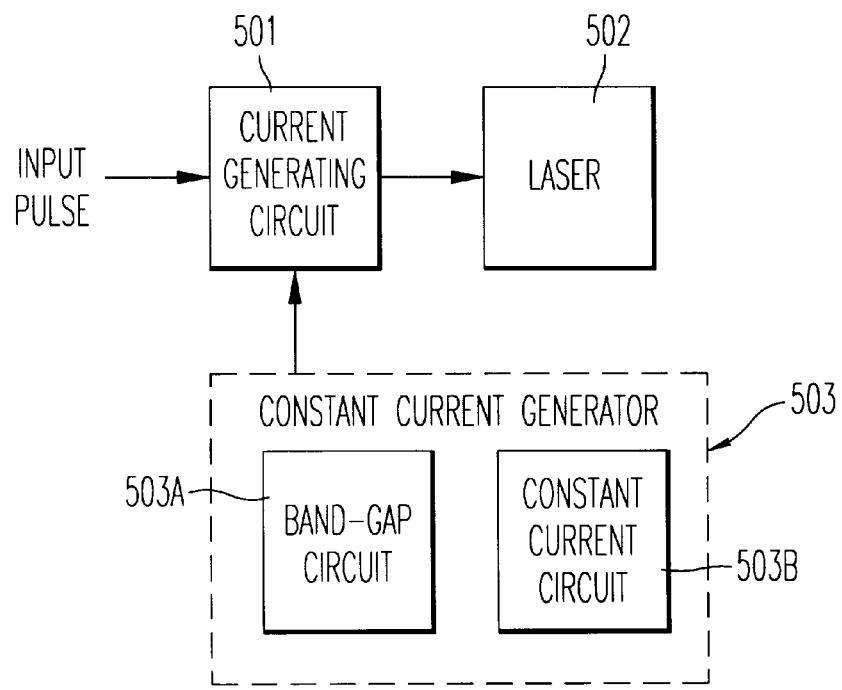
FIG. 13 is a block diagram showing an example of a laser driver circuit according to the embodiment of the present invention.

FIG. 13 is a block diagram showing an example of a laser driver circuit according to the embodiment of the present invention and including a first circuit 501 for generating a current for driving a laser 502 in response to a received an input pulse, a second circuit 503 for supplying a constant current to the first circuit 501 and including a band-gap reference circuit 503A and a constant current circuit 503B, as previously described.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed as new and desired to be secured by Letters Patent of the United States is:

1. A peak hold circuit comprising:
   an error amplification circuit including a first transistor section receiving an input voltage and a second transistor section constituting a differential error amplifier together with the first transistor section, the second transistor section having a plurality of transistors connected in parallel so as to operate individually;
   a switching circuit including a plurality of switching transistors operated in accordance with an operation voltage of each of the transistors of the second transistor section;
   a charging circuit including a capacitor, for charging the capacitor stage by stage in accordance with a switching operation of each of the switching transistors of the switching circuit; and
   an output circuit for outputting a charging potential of the capacitor as a peak value signal of the input voltage.

2. The peak hold circuit according to claim 1, wherein the first transistor section includes a plurality of transistors connected in parallel so as to operate simultaneously.

3. The peak hold circuit according to claim 1, wherein the switching transistors of the switching circuit includes a first-operated switching transistor having a current limitation resistor.

4. The peak hold circuit according to claim 1, wherein the output circuit includes an emitter follower circuit.

5. The peak hold circuit according to claim 1, wherein the output circuit includes a differential error amplifier and an emitter follower circuit.

6. The peak hold circuit according to claim 1, wherein the switching circuit includes a clamp circuit for clamping each of the transistors of the second transistor section of the error amplification circuit to a predetermined voltage.

7. The peak hold circuit according to claim 5, wherein the differential error amplifier includes a non-inverting input transistor and an inverting input transistor, and non-inverting signal and inverting signal are each supplied to a base of the inverting input transistor through a resistor.

8. The peak hold circuit according to claim 1, wherein the error amplification circuit includes a constant voltage generator circuit, and the constant voltage generator circuit includes:
   a band-gap reference voltage source section having a plurality of transistors and a plurality of resistors, for generating a constant voltage corresponding to a band-gap voltage of silicon; and
   a constant current source section having a current source circuit having a first transistor and a second transistor constituting an input stage of the band-gap reference voltage source section, a third transistor connected in series to the second transistor of the current-source circuit, a fourth transistor of a diode-connection type connected to a base of the third transistor, a first resistor connected between a power supply and a base of the fourth transistor, and a second resistor connected between the third transistor and ground.

9. A constant voltage generator circuit comprising:
   a band-gap reference voltage source section having a plurality of transistors and a plurality of resistors, for generating a constant voltage corresponding to a band-gap voltage of silicon; and
   a constant-current generator section having a current source circuit having a first transistor and a second transistor constituting an input stage of the band-gap reference voltage source section, a third transistor connected in series to the second transistor of the current-source circuit, a fourth transistor of a diode-connection type connected to a base of the third transistor, a first resistor connected between a power supply and a base of the fourth transistor, and a second resistor connected between the third transistor and ground.

10. A light-receiving circuit comprising:
    an optical semiconductor detector for converting a received light signal into a current signal;
    a differential trans-impedance amplifier for receiving the current signal and outputting a voltage signal;
    a peak detector including a first transistor section receiving an input voltage and a second transistor constituting a differential error amplifier together with the first transistor section, for detecting a peak value of the voltage signal output from the differential trans-impedance amplifier, the second transistor section having a plurality of transistors connected in parallel so as to operate individually, a switching circuit including a plurality of switching transistors operated in accordance with an operation voltage of each of the transistors of the second transistor section, a charging circuit including a capacitor, for charging the capacitor stage by stage in accordance with a switching operation of each of the switching transistors of the switching circuit, and a first output circuit for outputting a charging potential of the capacitor as a peak value signal of the input voltage; and
    a second output circuit for outputting a voltage signal corresponding to the light signal by processing a signal output from the peak detector.

11. The light-receiver circuit according to claim 10, wherein the peak detector includes a constant voltage generator circuit, and the constant voltage generator circuit includes:
- a band-gap reference voltage source section having a plurality of transistors and a plurality of resistors, for generating a constant voltage corresponding to a band-gap voltage of silicon; and
- a constant-current generator section having a current source circuit having a first transistor and a second transistor constituting an input stage of the band-gap reference voltage generator section, a third transistor connected in series to the second transistor of the current source circuit, a fourth transistor of a diode-connection type connected to a base of the third transistor, a first resistor connected between a power supply and a base of the fourth transistor, and a second resistor connected between the third transistor and ground.

12. A laser driver circuit for driving a laser in response to an input pulse, comprising:

- a first circuit for generating a current for driving the laser in response to the input pulse; and
- a second circuit for supplying at least a constant current to the first circuit, the second circuit including a band-gap reference voltage source section having a plurality of transistors and a plurality of resistors, for generating a constant voltage corresponding to a band-gap voltage of silicon, and a constant current generator section having a current source circuit having a first transistor and a second transistor constituting an input stage of the band-gap reference voltage source section, a third transistor connected in series to the second transistor of the current-source circuit, a fourth transistor of a diode-connection type connected to a base of the third transistor, a first resistor connected between a power supply and a base of the fourth transistor, and a second resistor connected between the third transistor and ground.

* * * * *